United States Patent [19]

Brault et al.

[11] Patent Number: 5,015,962
[45] Date of Patent: May 14, 1991

[54] PHASE DEMODULATOR AND ITS APPLICATION TO AN MLS TYPE LANDING SYSTEM

[75] Inventors: Daniel Brault, Montigny Les Cormeilles; Alain Grousseau, Conflans Ste Honorine, both of France

[73] Assignee: Thomson-CSF, Puteaux, France

[21] Appl. No.: 353,630

[22] PCT Filed: Aug. 30, 1988

[86] PCT No.: PCT/FR88/00428
§ 371 Date: Apr. 11, 1989
§ 102(e) Date: Apr. 11, 1989

[87] PCT Pub. No.: WO89/02188
PCT Pub. Date: Mar. 9, 1989

[30] Foreign Application Priority Data

Sep. 4, 1987 [FR] France ................ 87 12330

[51] Int. Cl.⁵ .................. H03D 3/06; H04L 27/22
[52] U.S. Cl. ............................................. 329/346
[58] Field of Search .............. 342/408; 329/346, 358, 329/360

[56] References Cited

U.S. PATENT DOCUMENTS 3,938,052 2/1976 Glasson et al. .
4,042,884 8/1977 Querry .

FOREIGN PATENT DOCUMENTS 2158984 5/1973 Fed. Rep. of Germany .
8600186 1/1986 PCT Int'l Appl. .

Primary Examiner—Theodore M. Blum
Attorney, Agent, or Firm—Marmorek, Guttman & Rubenstein

[57] ABSTRACT

Disclosed is a demodulator for a phase-modulated wave, of the DPSK type for example, applicable to an MLS system. It has a local oscillator, the phase of which is modulated. The signal thus modulated is mixed with the incident signal to be demodulated. The signal coming from the mixer is applied to a loop, the output signal of which:
   controls the phase modulator;
   constitutes the output signal of the device.

5 Claims, 3 Drawing Sheets

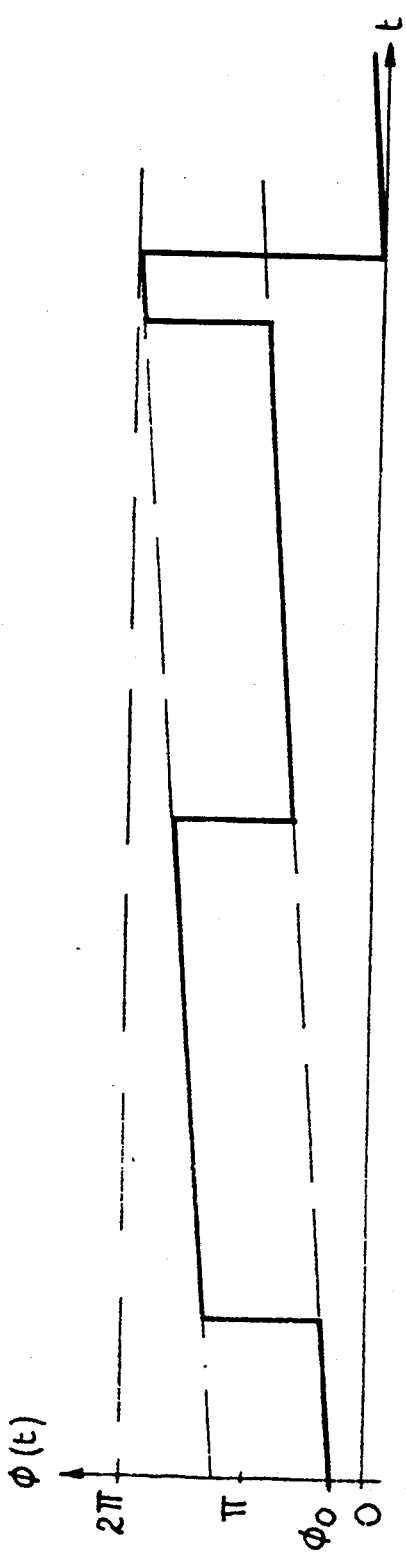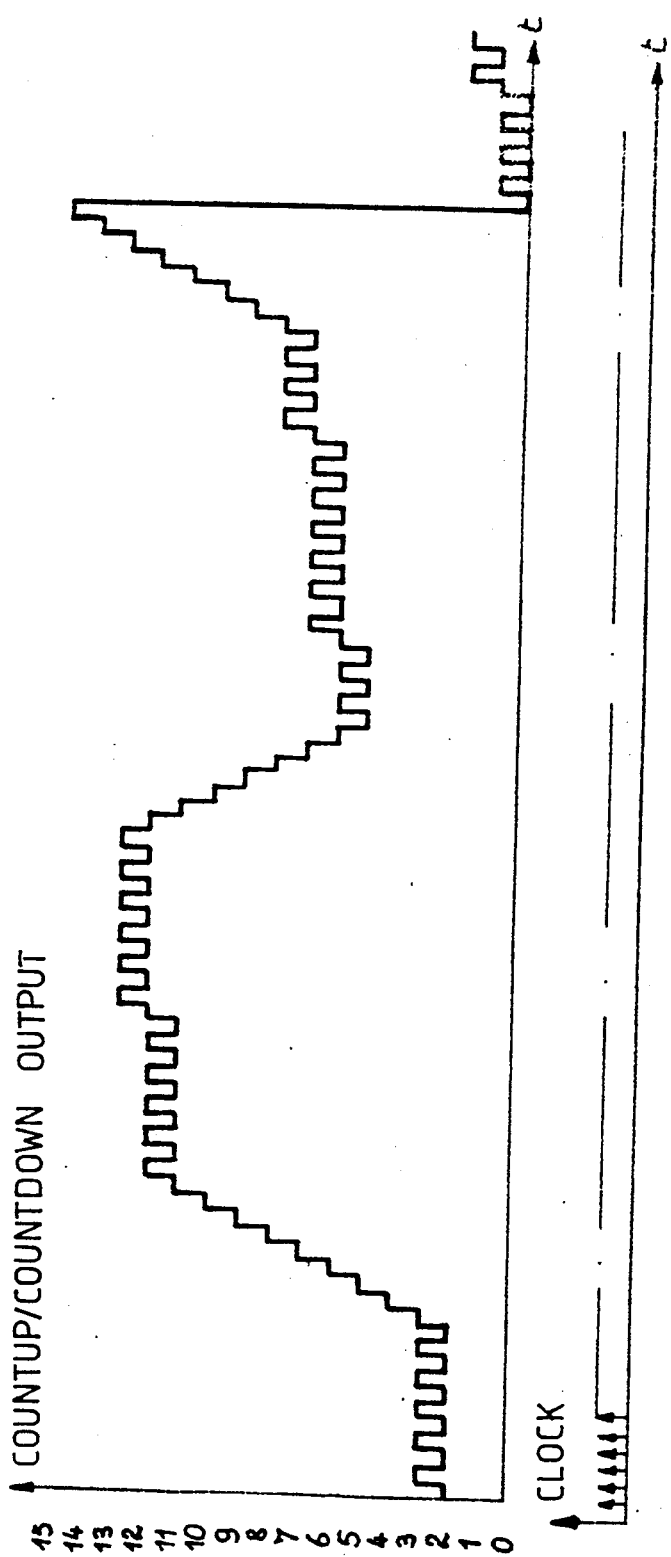

PHASE DEMODULATOR AND ITS APPLICATION TO AN MLS TYPE LANDING SYSTEM

BACKGROUND OF THE INVENTION

1. Field of the Invention

An object of the present invention is a phase demodulator of the DPSK (differential phase shift keying) type.

Another object of the invention is the application of this device to a landing aid system of the MLS (microwave landing system) type.

2. Description of the Prior Art

Increasing use is being made, in data transmission, of the modulation of the phase of a radioelectrical carrier wave. In general the signal is written as:

$$s(t) = A \cdot \text{Sin}\ [\omega_o t + \theta(t)] \quad (1)$$

where A is the amplitude of this signal, $\omega_O$ is the pulsation that corresponds to the carrier frequency and O(t), is the modulation frequency as a function of time. For biphase shift keying (BPSK) modulation, the signal $\theta(t)$ will be equal alternately to 0 or to $\pi$ depending on whether the bit sent is 0 or 1. This type of modulation can be extended to multiple-phase shift keying (MPSK) modulation.

At reception, it is therefore necessary to demodulate (or decode) the signal received to extract the useful signal $\theta(t)$ in the composite signal s(t). The demodulator according to the invention aims at achieving a demodulation of this type when neither the frequency nor the phase of the carrier wave is known with precision.

To resolve this problem, various approaches are known and are especially described in Spilker Jr., *Digital Communications by Satellite*, Prentice Hall. One of these approaches, described on page 304 and called the Costa loop, uses a voltage controlled oscillator (VCO) and an automatic control loop. Another approach, described on page 302, also uses a VCO type oscillator and automatic control loops, It further comprises frequency doubling devices. The main drawback of these devices is their complicated nature and the fact that they require a VCO-type oscillator, which makes them expensive.

An object of the present invention is a phase demodulator which, in particular, does not require any oscillator of the VCO type.

To this end, it uses an oscillator feeding a phase demodulator. The output signal of the phase demodulator is mixed with the demodulated signal and is applied to a loop, the output signal of which:

controls the demodulator;
constitutes the output signal of the demodulator.

SUMMARY OF THE INVENTION

More precisely, an object of the invention is:
A phase demodulator comprising:
means (2) for modulating the phase of the first signal ($S_1$) of fixed frequency ($w_1$) neighbouring the frequency ($w_o$) of a second signal (s(t)), to be demodulated;
means (5;51) enabling the mixing of the above two signals;
means (3) forming a loop filter receiving the signal ($S_5$; $S_{51}$) coming from the mixing means, the output signal of said loop filter means (3) providing for the control of the modulation means (2);
processing means (4) providing for filtering operation, and receiving the output signal of the loop filter means and forming the output signal of the device.

BRIEF DESCRIPTION OF THE DRAWINGS

Other objects, special features and results of the invention will emerge from the following description, given as a non-restrictive example and illustrated by the appended drawings, of which:

FIGS. 3, and 4a–4c are explanatory drawings showing the operation of the device according to the invention.

In these different figures, the same references refer to the same elements.

DESCRIPTION OF A PREFERRED EMBODIMENT

Figure 1:
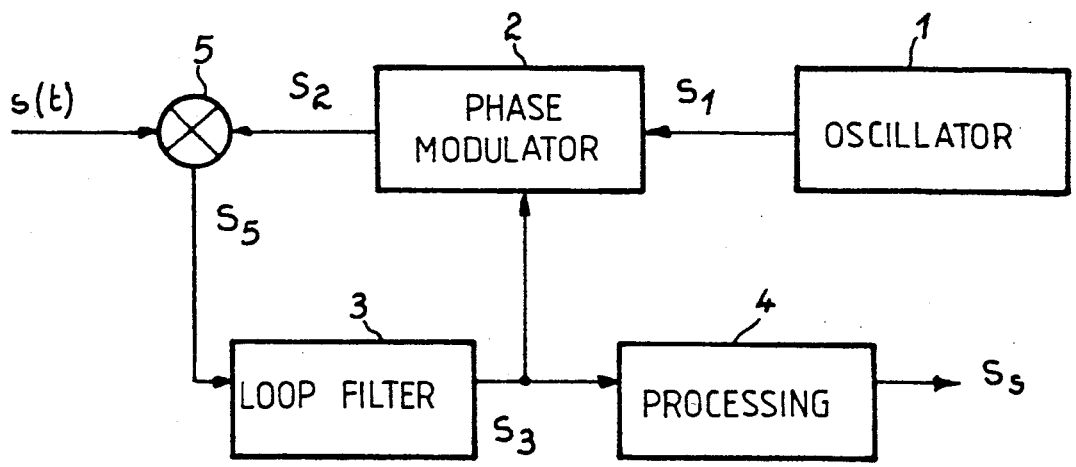
FIG. 1 is a schematic diagram showing the working of the device according to the invention.

FIG. 1 shows a schematic diagram of the device according to the invention.

It has an oscillator 1 giving a signal $S_1$ at a constant and stable frequency which is written as follows:

$$S_1 = A_1 \cdot \text{Sin}\ \omega_1 t \quad (2)$$

where $A_1$ is its amplitude and $\omega_1$ is its pulsation.

This signal is directed towards a phase modulator 2. The output signal $S_2$ of the modulator 2 is written:

$$S_2 = A_2 \cdot \text{Sin}\ [\omega_1 t + \phi(t)] \quad (3)$$

where $A_2$ is the amplitude of the signal and $\phi(t)$ is the phase modulation achieved by the modulator 2.

The signal $S_2$ is then mixed with the input signal to be demodulated s(t) given by the expression (1). The output signal of the mixer 5 is written:

$$S_5 = K \cdot A \cdot A_2 \cdot \text{Sin}\ [\omega_o t + \theta(t)] \cdot \text{Sin}\ [\omega_1 t + \theta(t)]$$

If $\omega_1$ is close to $\omega_0$ and letting:

$$\omega_o - \omega_1 = \Delta\omega,$$

we get:

$$S_5 = K \cdot A \cdot A_2 \cdot \{\cos\ [\Delta\omega \cdot t + \theta(t) - \phi(t)] - \cos\ [(2\omega_o - \Delta\omega)t + \theta(t) + \phi(t)]\}$$

The signal $S_5$ is converted, after low pass filtering done in a loop filter 3, into a signal $S_3$ which is written:

$$S_3 = k \cdot A \cdot A_2 \cdot \cos\ [\Delta\omega \cdot t + \theta(t) - \phi(x)] \quad (4)$$

The signal $S_3$ firstly enables the control of the modulator 2 thus forming a loop and secondly constitutes, after passage through a standard processing circuit 4 which notably performs a filtering, the output signal $S_s$ of the device.

For, the phase loop when it functions in its normal range of operation, tends to cancel out the signal $S_3$ applied to the modulator 2, this signal playing the role of an error signal. This is written as:

$$k \cdot A \cdot A_2 \cdot \cos\ [\Delta\omega \cdot t + \theta(t) - \phi(t)] \rightarrow 0$$

namely:

$$\Delta\omega \cdot t + \theta(t) - \phi(t) = \frac{\pi}{2} + \sim\pi$$

or:

$$\phi(t) = \phi_o + \Delta\omega \cdot t + \theta(t) \tag{5}$$

with:

$\phi_o$: constant;

$\Delta\omega$ corresponding to the difference between the frequency of the received signal s(t) and the signal $S_1$ given by the local oscillator;

$\theta(t)$: modulation signal sought.

It would appear that the filtering done by the circuit 4 removes the need for the dc signal $\phi_o$ and the low frequency signal $\Delta\omega_t$ to preserve only the signal $\theta(t)$ sought, provided that the phase variation corresponding to $\Delta\omega$ remains slow compared with the variation due to the modulation $\theta(t)$.

This is therefore done, according to the invention, without reconstitution of the carrier (sin $\omega_o t$) of the emitted signal.

Figure 2:
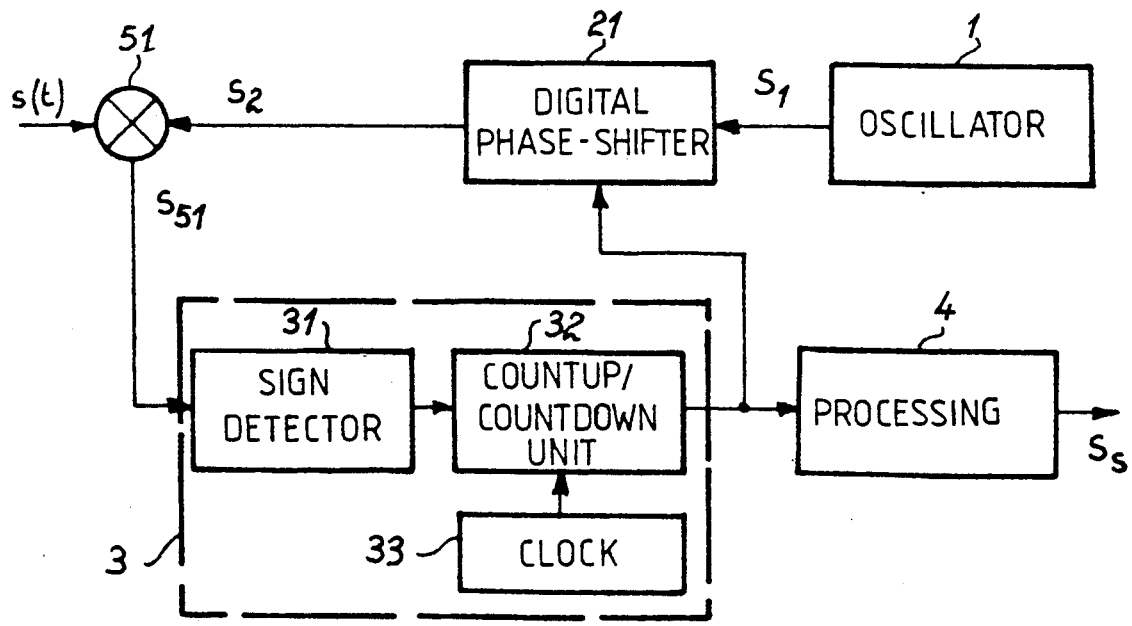
FIG. 2 shows an embodiment of device represented in the preceding figure.

FIG. 2 shows one embodiment of the device shown in the diagram of FIG. 1.

This figure again has the local oscillator 1 which gives the fixed frequency signal $S_1$. This signal $S_1$ has its phase modulated by a digital phase shifter 21. The output signal $S_2$ of the phase shifter 21 is directed to a mixer which, in this embodiment, is a phase comparison device 51 wherein its phase is compared with that of the input signal s(t) to deliver a signal $S_{51}$. This signal $S_{51}$ is processed in the loop filter 3, which herein consists of a sign detector 31, which has the function of detecting the positive or negative sign of the signal $S_{51}$, and a counter/countdown unit 31 which counts or counts down at the rate of a clock 33 depending on the sign of the signal $S_{51}$. The sign detector 31 is made, for example, with a comparator that compares the incident signal $S_{51}$ with the 0 volt level. The clock 33 is a fast clock compared with the frequency of the modulation signal. For example, it is 100 times faster.

The output signal of the set 3, marked $S_3$, firstly controls the digital phase shifter 21 and, secondly, is addressed to the processing (filtering) circuit 4 to constitute the output signal $S_s$ of the device.

This circuit works as explained above, i.e. the phase loop tends to cancel out the signal that flows in it and does so for each of the successive samples. In other words, the digital phase shifter 21 follows the development of the differential phase between the local oscillator and the signal s(t) to be demodulated, regardless of the variation speed of this phase provided that it remains low compared with the frequency of the clock 33. At the output of the counter/countdown unt 32, there is therefore a signal such as is given by the above expression (5), namely:

$$\phi(t) = \phi_o + \Delta\omega \cdot t + \theta(t)$$

In practice, since the phase shifter 21 is quantified and the counter/countdown unit 32 is never off, the system has no stable state. Its operation is illustrated below with reference to FIGS. 3 and 4.

Figure 3:
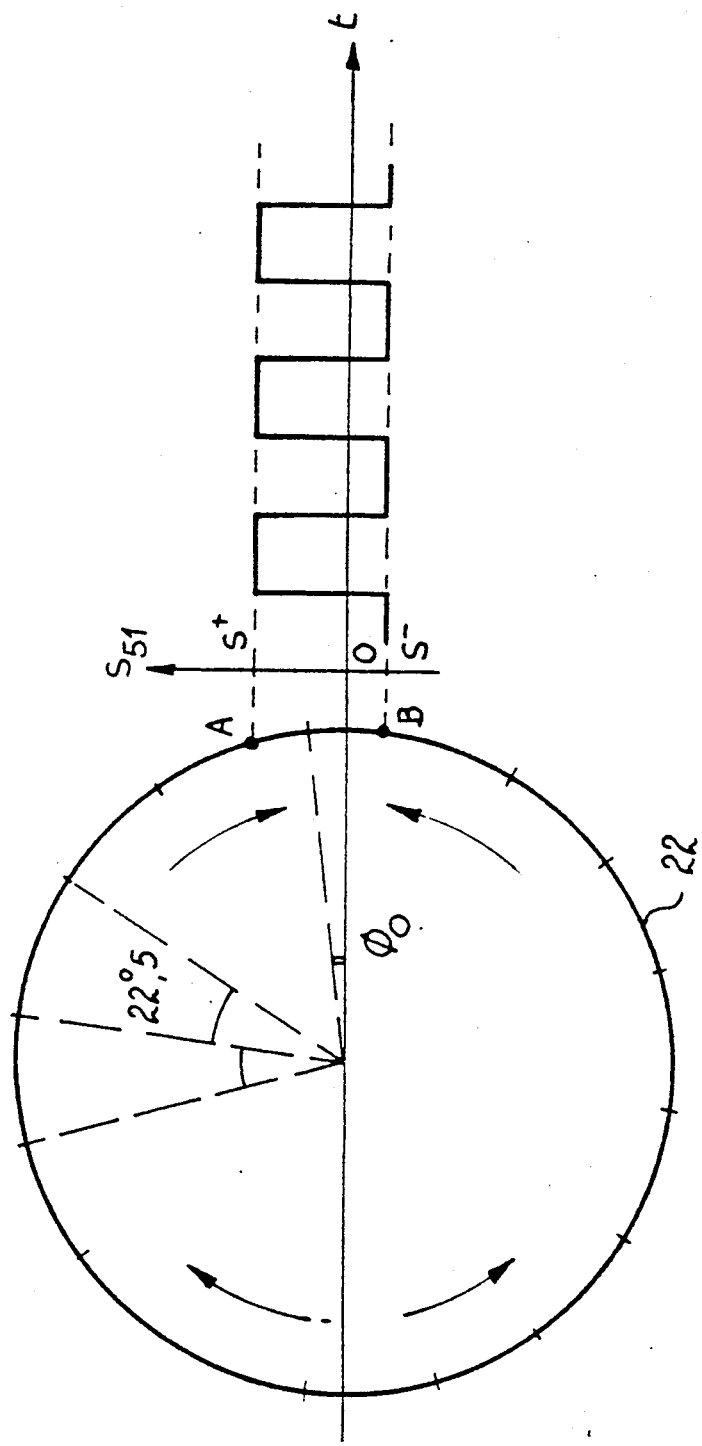

FIG. 3 is a diagram showing the operation of the device of the above figure in the case where $\Delta\omega_t = 0$ and where there is no phase leap due to the modulation ($\theta = 0$), namely, $\phi(t) = \phi_o$.

The phase shifts which the phase shifter 21 could impose on the signal $S_1$ has been shown in a circle 22. These phase shifts occur, for example, at a pitch of 22.5°. The figure also shows the output signal of the phase comparator 51 when there is no phase leap due to the modulation: it is then a voltage $S_{51}$ varying between a positive value (S+) and a negative value (S−). These two values are not necessarily equal in terms of absolute value. A and B represent the corresponding points on the circle of phases 22. The points A and B are located on either side of the value $\phi_o$. The system therefore oscillates between these two phase values.

When the modulation signal $\theta(t)$ is equal to $\pi$, the value of $\phi(t)$ passes through a point of the circle 22 which is diametrically opposite to A or B and then returns (as shown by arrows in the figure) as and when there are clock 33 pips at A or B (8 pips in the example of the figure). It is the sign of the signal ($S_{51}$) coming from the phase detector which is taken into account to trigger, as the case may be, an increment or decrement in the phase of the signal $S_1$.

It would thus seem that the points A and B constitute the idle position, in the automatic linking, between two phase leaps, with constant seeking of equilibrium.

Thus a convergent system has been created without any stable position. For, if not, the values of $\phi(t)$ given by the system would be given by it to within the nearest $n.\pi$, thus preventing the demodulation of a phase modulation $O - \pi$.

FIGS. 4a to 4c illustrate the working of the device of FIG. 2 in a general case where:

$$\phi(t) = \phi_o \Delta\omega . t + \theta(t)$$

The graph 4a represents, as a function of time, the variation between 0 and $2\pi$ of the phase $\phi(t)$ resulting from the superimposition of a modulation $O - \pi$, the quantity $\Delta\omega.t$ considered as a permanent sliding process (a continuous ramp with a gradient given by the value of $\Delta\omega$) and the constant quantity $\phi_o$.

The graph 4c represents the succession in time of the clock 33 pips.

The graph 4b shows the development of the output signal of the counter/countdown unit 32. It would appear that this signal follows the variations of the phase shown in FIG. 4a at the rate of the clock 33.

The demodulator as described above is especially applicable to a sequential system of data transmission wherein several stations $S_1 \ldots S_n$ receive a message from a preceding station, decode it and send it on to the next station. In this case, each station necessarily has a local oscillator, tuned to the allocated channel but not synchronous with the other stations. According to the invention, this signal replaces the oscillator 1 and is sufficient to decode the signals received without its being necessary to use a VCO type oscillator. The different stations mentioned above are, for example, those of an MLS system.

The device according to the invention is, of course, not restricted to the particular embodiments described herein. Thus, in particular, the device of FIG. 2 has been described in the context of an $o - \pi$ BPSK modulation, but it can be used for the demodulation of an MPSK modulation provided that the phase variation due to the difference $\Delta\omega$ remains, as stated above, sufficiently slower than the phase variation due to the modulation $\theta(t)$ so that these two variations can be separated.

We claim:

1. A phase demodulator comprising modulating means for modulating the phase of a first signal $S_1$ of frequency $w_1$ to produce a second signal $S_2$, said frequency $w_1$ being close to the frequency $w_0$ of an input signal $s(t)$ to be demodulated, mixing means for mixing said input signal $s(t)$ and said second signal $S_2$ to form a mixing means output signal, loop filter means for receiving said mixing means output signal and for forming a loop filter means output signal for controlling said modulating means, and processing means for receiving said loop filter means output signal and for forming an output signal of said phase demodulator.

2. The phase demodulator of claim 1 wherein said phase demodulator further comprises an oscillator for providing said first signal $S_1$.

3. The phase demodulator of claim 1 wherein said modulation mean comprises a digital phase shifter.

4. The phase demodulator of claim 1 wherein said mixing means includes a phase comparison device for comparing the phase of said input signal $s(t)$ with the phase of said second signal $S_2$.

5. The phase demodulator of claim 1 wherein said loop filter means comprises a sign detector, a clock and a countup/countdown unit, said countup/countdown unit giving a digital value which is incremented or decremented by a unit, depending on a command of the sign detector, at a rate determined by said clock.

* * * * *